United States Patent
Nealey et al.

(10) Patent No.: US 9,580,534 B2
(45) Date of Patent: Feb. 28, 2017

(54) BLOCK COPOLYMER MATERIALS FOR DIRECTED ASSEMBLY OF THIN FILMS

(75) Inventors: Paul Franklin Nealey, Madison, WI (US); Frank S. Bates, St. Louis Park, MN (US); Sangwon Kim, Minneapolis, MN (US)

(73) Assignees: Wisconsin Alumni Research Foundation, Madison, WI (US); The Regents of the University of Minnesota, Minneapolis, MN (US)

( * ) Notice: Subject to any disclaimer, the term of this patent is extended or adjusted under 35 U.S.C. 154(b) by 1060 days.

(21) Appl. No.: 13/560,016

(22) Filed: Jul. 27, 2012

(65) Prior Publication Data
US 2013/0029113 A1    Jan. 31, 2013

Related U.S. Application Data

(60) Provisional application No. 61/513,343, filed on Jul. 29, 2011.

(51) Int. Cl.
*C08F 8/08* (2006.01)
*B32B 3/10* (2006.01)
(Continued)

(52) U.S. Cl.
CPC ............ *C08F 297/02* (2013.01); *B82Y 10/00* (2013.01); *B82Y 40/00* (2013.01); *C08F 8/08* (2013.01);
(Continued)

(58) Field of Classification Search
CPC ...................................... B82Y 40/00
See application file for complete search history.

(56) References Cited

U.S. PATENT DOCUMENTS 6,576,692 B1    6/2003   Ohtsuka et al.

FOREIGN PATENT DOCUMENTS

EP    0881234       6/2003
JP    2002-317009   10/2012
(Continued)

OTHER PUBLICATIONS

"Mapping Large Regions of Diblock Copolymer Phase Space by Selective Chemical Modification," Davidock et al., Macromolecules, 2004, 37, 397-407.*
(Continued)

*Primary Examiner* — Ian Rummel
(74) *Attorney, Agent, or Firm* — Weaver Austin Villeneuve & Sampson LLP

(57) ABSTRACT

Provided herein are methods of formulating and engineering block copolymer (BCP) systems for directed self-assembly (DSA) processes. In some embodiments, the methods involve engineering a BCP material based on the interaction parameter ($\chi$) of the material and the surface and/or interaction energies of its constituent blocks. Also provided are novel block BCP materials that can be used in DSA techniques. In some embodiments, the BCP systems described herein have micro-phase separating blocks, with at least one block including multiple types of repeat units. Also provided are structures formed by DSA, including structures having a sub-20 nm dimension. Applications included nanolithography for semiconductor devices, fabrication of cell-based assays, nanoprinting, photovoltaic cells, and surface-conduction electron-emitter displays.

16 Claims, 10 Drawing Sheets

(51) Int. Cl.
- *C08F 293/00* (2006.01)
- *C08F 297/02* (2006.01)
- *B82Y 40/00* (2011.01)
- *C08F 236/08* (2006.01)
- *C08F 297/04* (2006.01)
- *G03F 7/00* (2006.01)
- *G03F 7/16* (2006.01)
- *B82Y 10/00* (2011.01)
- *C08C 19/06* (2006.01)
- *C08F 212/08* (2006.01)

(52) U.S. Cl.
CPC ........ *C08F 236/08* (2013.01); *C08F 297/046* (2013.01); *G03F 7/0002* (2013.01); *G03F 7/165* (2013.01); *C08C 19/06* (2013.01); *C08F 212/08* (2013.01); *C08F 2438/02* (2013.01); *Y10T 428/24802* (2015.01)

(56) References Cited

FOREIGN PATENT DOCUMENTS

| | | |
|---|---|---|
| WO | 2009/151824 | 12/2009 |
| WO | 2009/151834 | 12/2009 |

OTHER PUBLICATIONS

"Temperature Dependence of the Interaction Parameter of Polystyrene and Poly(methyl methacyrlate)," Russell et al., Macromolecules, 1990, 23, 890-893.*

"Interfacial Segregation in Disordered Block Copolymers: Effect of Tunable Surface Potentials," Mansky et al., 1997, Physical Review Letters, vol. 79, No. 2, p. 237-240.*

"Selectively Epoxidized Polyisoprene-Polybutadien Block Copolymer," Grubs et al., Macromolecules, 2000, 33, 2308-2310.*

Kim, Sangwon, et al., "Decoupling Bulk Thermodynamics and Wetting Characteristics of Block Copolymer Thin Films," ACS Macro Letters, *American Chemical Society*, Feb. 2012, vol. 1, pp. 11-14.

International Search Report and Written Opinion mailed Oct. 9, 2012, issued in Application No. PCT/US2012/048720.

Park, et al., "Enabling Nanotechnology with Self Assembled Block Copolymer Patterns," Polymer, 44, 2003, pp. 6725-6760.

Notice of Reasons for Rejection dated May 17, 2016, issued in Application No. 2014-523098.

* cited by examiner

US 9,580,534 B2

BLOCK COPOLYMER MATERIALS FOR DIRECTED ASSEMBLY OF THIN FILMS

CROSS-REFERENCE TO RELATED APPLICATION

This application claims benefit under 35 USC §119(e) to U.S. Provisional Patent Application No. 61/513,343, filed Jul. 29, 2011, which is incorporated by reference herein.

STATEMENT OF GOVERNMENT SUPPORT

This invention was made with government support under 0832760 awarded by the National Science Foundation. The government has rights in the invention.

BACKGROUND OF THE INVENTION

Block copolymers (BCPs) are a class of polymers synthesized from two or more polymeric blocks. The structure of diblock copolymer A-b-B may correspond, for example, to AAAAAAA-BBBBBBBB. The interaction parameter $\chi$ of a BCP is related to the energy of mixing the blocks in a block copolymer and is inversely proportional to temperature. The graph in FIG. 14 shows an example of $\chi N$ (where N is the degree of polymerization) as a function of the volume fraction, f, of a block (A) in a diblock (A-b-B) copolymer. FIG. 14 shows that at a particular temperature and volume fraction of A, the diblock copolymers microphase separate into domains of different morphological features. In the example of FIG. 14, when the volume fraction of either block is around 0.1, the block copolymer will microphase separate into spherical domains (S), where one block of the copolymer surrounds spheres of the other block. As the volume fraction of either block nears around 0.2-0.3, the blocks separate to form a hexagonal array of cylinders (C), where one block of the copolymer surrounds cylinders of the other block. And when the volume fractions of the blocks are approximately equal, lamellar domains (L) or alternating stripes of the blocks are formed. Representations of the cylindrical and lamellar domains at a molecular level are also shown. The phase behavior of block copolymers containing more than two types of blocks (e.g., A-b-B-b-C) also results in microphase separation into different domains. The self-assembly of block copolymer materials in bulk and the translation of ordered block copolymer domains into thin-films has emerged as a powerful approach to create functional nanostructures and templates for various applications.

SUMMARY

Provided herein are methods of formulating and engineering block copolymer (BCP) systems for directed self-assembly (DSA) processes. In some embodiments, the methods involve engineering a BCP material based on the interaction parameter ($\chi$) of the material and the surface and/or interaction energies of its constituent blocks. Also provided are novel block BCP materials that can be used in DSA techniques. In some embodiments, the BCP systems described herein have micro-phase separating blocks, with at least one block including multiple types of repeat units. Also provided are structures formed by DSA, including structures having a sub-20 nm dimension. Applications included nanolithography for semiconductor devices, fabrication of cell-based assays, nanoprinting, photovoltaic cells, and surface-conduction electron-emitter displays.

One aspect relates to a method of formulating a block copolymer material for directed assembly, including modifying a first block of a first block copolymer to form a modified block copolymer including the modified block. The interaction parameter ($\chi$) of the modified block copolymer is larger than that of the unmodified first block copolymer. In certain embodiments, the modified block copolymer has an interaction parameter larger than that of PS-b-PMMA at particular temperature of assembly. The first block copolymer can be a diblock, triblock or higher order block copolymer. For example, the B block of a diblock A-b-B block copolymer can be modified to form an A-b-B' block copolymer. The B' block of the A-b-B' block copolymer can be a B-C statistical or random copolymer in some embodiments. In some embodiments, the B' block can include B monomers, a fraction of which are modified with a function group. In some embodiments, surface or interfacial energies of the A and B' blocks of a modified A-b-B' block copolymer are commensurate with each other. In some embodiments, the difference in surface or interfacial energies between the A and B' blocks is no more than the difference in surface or interfacial energies of PS and PMMA at a particular temperature of assembly.

Modifying a first block can involve synthesizing the modified block copolymer or a post-synthesis modification. For example, in some embodiments, modifying a B block involves modifying the B block of a synthesized A-b-B block copolymer. In some embodiments, modifying a B block involves synthesizing a A-b-B' block copolymer.

In some embodiments, the methods further involve modifying a second block of the first block copolymer to form the modified block copolymer including the first and second modified blocks. For example, A and B blocks of an A-b-B block copolymer can be modified to form an A'-b-B' block copolymer. In some embodiments, modifying a block includes addition of a functional group or other chemical modification. Sulfonation, fluorination, hydrogenation, epoxidation, polyhedral oligomeric silsesquioxanes attachment, and liquid crystal attachment are examples of chemical modification according to various embodiments.

Another aspect relates to a method of formulating a block copolymer material for directed assembly that involves partially epoxidizing a first block of a first block copolymer to form a epoxidized block copolymer including the partially epoxidized block, wherein the interaction parameter ($\chi$) of the epoxidized block copolymer is larger than that of the first block copolymer at particular temperature of assembly.

In certain embodiments, the epoxidized block copolymer has an interaction parameter larger than that of PS-b-PMMA at particular temperature of assembly. The first block copolymer can be a diblock, triblock or higher order block copolymer. In some embodiments, the B' block can include B monomers, a fraction of which are modified with a function group. In some embodiments, surface or interfacial energies of the A and B' blocks of a modified A-b-B' block copolymer are commensurate with each other. In some embodiments, the difference in surface or interfacial energies between the A and B' blocks is no more than the difference in surface or interfacial energies of PS and PMMA at a particular temperature of assembly.

Another aspect relates to a method of formulating a block copolymer material for directed assembly involving identifying a reference block copolymer; systematically modifying one block of the reference block copolymer to generate a plurality of modified block copolymers; for each of the plurality of modified block copolymers, determining a) an interaction parameter ($\chi$) and b) the relative surface energies or interfacial energies of the blocks of the modified block copolymer; and based on the interaction parameters and the relative surface energies, selecting one of the plurality of modified block copolymers.

According to various embodiments, the reference block copolymer and modified block copolymers can be diblock copolymers, triblock or higher order block copolymers. Determining the relative surface or interfacial energies can involve directing the assembly of the modified block copolymers. In some embodiments, all of the blocks of the reference block copolymer are pure blocks. In some other embodiments, one or more of the blocks of the reference block copolymer are modified.

In some embodiments, systematically modifying a block of the block copolymer can involve changing a pure component block to a random or statistical copolymer. For, example, a pure B block of an A-b-B reference block copolymer can be modified to a B' block with B' a B-r-C random or statistical copolymer of B and C monomers or other repeat units. In some embodiments, the C repeat unit can be chosen such the surface or interfacial energy of a pure A block is between that of a pure B block and that of a pure C block. In the same or different embodiments, the C repeat unit of the B-r-C copolymer can be chosen based on information about the interaction parameter ($\chi$) between a pure A block and a pure B block and the interaction parameter ($\chi$) between a pure A block and a pure C block.

Another aspect relates to a structure including a chemically patterned substrate and a thin film block copolymer material disposed on the chemically patterned substrate. The thin turn block copolymer material has microphase-separated domains registered with the pattern of the underlying chemically patterned substrate and the block copolymer material includes a block copolymer of which at least one block includes multiple different repeat units. The at least one block can be a random or statistical copolymer in some embodiments. According to various embodiments, assembled block copolymer material may have a domain dimension of a less than 25 nm, less than 20 nm, less than 15 nm, or less than 10 nm.

Another aspect relates to a structure including a substrate having topographical features and a thin film block copolymer material disposed on the substrate, having microphase-separated domains. The block copolymer material is assembled on the substrate by the topographical features and includes a block copolymer of which at least one block includes multiple different repeat units. The at least one block can be a random or statistical copolymer in some embodiments. According to various embodiments, assembled block copolymer material may have a domain dimension of a less than 25 nm, less than 20 nm, less than 15 nm, or less than 10 nm.

Another aspect relates to a composition including a modified poly(styrene-b-isoprene) block copolymer, wherein the polyisoprene block is partially modified with epoxy functional groups. In some embodiments, about 50% to about 90% of the polyisoprene block is modified with epoxy functional groups. In some embodiments, about 70% to 80% of the polyisoprene block is modified with epoxy functional groups.

These and other aspects of the invention are discussed further below with reference to the figures.

DESCRIPTION

Figure 1:
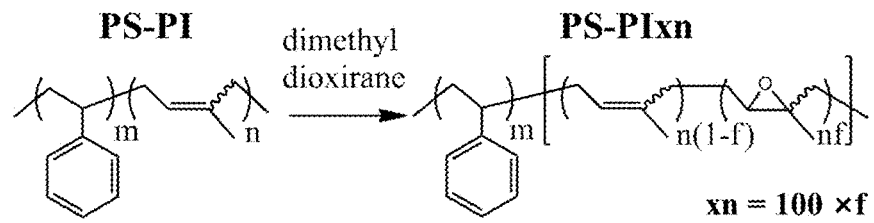
FIG. 1 shows epoxidation of PS-PI diblock copolymer. The partially epoxidized PS-PI is denoted as PS-PIxn while f and xn (A) represent the mole fraction and degree of epoxidation, respectively.

Provided herein are novel block copolymer (BCP) materials that can be used in directed self-assembly (DSA) techniques. In some embodiments, the BCP systems described herein have micro-phase separating blocks, with at least one block including more than one type of repeat unit. Also provided are methods of formulating and engineering BCPs for DSA processes. In some embodiments, the methods involve engineering a BCP material based on the effective interaction parameter ($\chi_{eff}$) of the material and the surface and/or interaction energies of its constituent blocks. Also provided are structures formed by DSA, including structures having a sub-20 nm dimension. Applications included nanolithography for semiconductor devices, fabrication of cell-based assays, nanoprinting, photovoltaic cells, and surface-conduction electron-emitter displays.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention.

The fabrication of well-defined chemical patterns, in terms of both chemistry and geometry, has become critical for a number of important applications. Directed self-assembly (DSA) of block copolymer (BCP) films is a patterning technique that combines the ability of BCPs to self-assemble into nanoscale features with the use of lithographic tools and materials to guide the assembly of BCP domains into desired structures. Previous studies have shown that DSA can mitigate variation in pattern line-width, accommodate mismatch between the natural BCP period and the guiding substrate pattern, achieve different essential geometries, and multiplicatively increase the pattern density compared to other patterning techniques.

As used herein, directed self-assembly of block copolymers can include graphoepitaxy methods and chemical epitaxy methods. DSA by graphoepitaxy generally involves directing the assembly of a BCP on a substrate by relief or topographical features of the substrate. DSA by chemical epitaxy methods generally involves directing the assembly of a BCP by a chemical template or pattern on the substrate. In some implementations, DSA involve annealing a BCP material in the presence of the substrate, such that the topographical or chemical patterns direct the assembly of the BCP material. Annealing can include thermal and solvent annealing techniques. Previous studies on directed assembly focus on poly(styrene-b-methyl methacrylate) (PS-PMMA) block copolymers; however, the smallest feature achievable dimension PS-PMMA is about 25 nm.

One aspect of the invention relates to novel BCPs that can be used in DSA. In some implementations, for example, the BCPs allow sub-25 nm or sub-10 nm structures to be achieved with DSA. Another aspect relates to methods of formulating BCPs. In some implementations, formulated BCPs can be used for DSA. Another aspect of the invention relates to structures formed by DSA using the techniques described herein. In some implementations, for example, structures having a smallest dimension of less than 25 nm, less than 20 nm, less than 15 nm or less than 10 nm, according to the desired implementation are provided. Applications included nanolithography for semiconductor devices (e.g., in the fabrication of integrated circuits and hard drives), fabrication of cell-based assays (e.g., assay platforms using nanochannels, nanopores, and nanochambers), nanoprinting, photovoltaic cells, and surface-conduction electron-emitter displays (e.g., next generation flat screen displays)

BCP Systems

In some embodiments, the BCP systems that have at least one block that is not a pure component block are provided. Block copolymers having pure component blocks can be represented as A-b-B diblock copolymers, A-b-B-b-C triblock copolymers, and so on for higher order multiblock systems. For example, for a diblock copolymer systems, the chemical composition of the base molecule can be represented as A-A-A-A-A-A-A-A-A-B-B-B-B-B-B-B-B-B-B, with A and B each representing a different type of repeat unit or monomer polymerized into the polymer chain. For triblock copolymer systems, the chemical composition of the base molecule could be represented as: A-A-A-A-A-A-A-A-A-A-B-B-B-B-B-B-B-B-B-B-A-A-A-A-A-A-A-A-A-A-A or A-A-A-A-A-A-A-A-A-A-B-B-B-B-B-B-B-B-B-B-C-C-C-C-C-C-C-C-C-C, with A, B, and C each representing a different type of repeat unit or monomer. In these examples, A, B and C are pure component blocks. Examples of A-B diblock copolymer systems include:

| A repeat unit or monomer | B repeat unit or monomer | Block Copolymer |
|---|---|---|
| styrene | Methymethacrylate | PS-PMMA |
| styrene | ethylene oxide | PS-PEO |
| styrene | Dimethylsiloxane | PS-PDMS |

In the examples given above, A, B and C are pure component blocks, each having only one type of repeat unit or monomer. In some embodiments, BCPs are provided that have random or statistical copolymers as blocks rather than pure component blocks. One example is to use a random copolymer as one block in a diblock copolymer system: A-A-A-A-A-A-A-A-A-A-A-B-C-C-B-C-B-B-C-B-C. In this example, A is a pure component block, but the second block is a random copolymer of B and C, which can be denoted B-r-C or B-ran-C. Other examples are given below:

| First Block | Second Block | Block Copolymer |
|---|---|---|
| A-C-A-A-C-C-A-C-C-C (A-r-C) | B-C-C-B-C-B-B-C-B-C (B-r-C) | P(A-r-C)-P(B-r-C) |
| A-D-A-A-D-D-A-D-D-D (A-r-D) | B-C-C-B-C-B-B-C-B-C (B-r-C) | P(A-r-D)-P(B-r-C) |

Triblock and higher order multiblock copolymers having at least one block that is not a pure component block are also provided herein. The examples given above are mere examples and are non-limiting. For example, a copolymer sequence in a block is not necessarily strictly random in some embodiments. A copolymer sequence is not limited by a particular degree of polydispersity or randomness. The block copolymer system can be any block copolymer system that undergoes micro-phase separation, self-assembly, or order-disorder processes, and can be used as a material for directed assembly. In some embodiments, a constituent C of a B-C copolymer is a B monomer or repeat unit that is modified with a functional group, X.

In some embodiments, BCP systems that have effective interaction parameters ($\chi_{eff}$) greater than that of PS-PMMA are provided. (An effective interaction parameter may also be referred to as an interaction parameter $\chi$ of a material in this document.) The interaction parameter $\chi$ is temperature-dependent; the BCP systems have $\chi$'s greater than that of PS-PMMA at the temperature of assembly. In some embodiments, BCP systems in which the constituent blocks have commensurate surface and/or interfacial energies are provided. Surface energy, as used herein, refers to energy at the surface between a condensed and non-condensed phase, such as a solid BCP thin film or BCP film in the melt and a gas or vacuum. Interfacial energy, as used herein, refers to energy at the surface between two condensed phases, such as a solid BCP thin film or BCP thin film in the melt and a liquid or solid. In some embodiments, surface or interfacial energies of the blocks of a BCP system are commensurate such that the BCP system can assemble with non-preferential wetting of domains of different blocks at a surface or interface. For example, in some embodiments, the surface or interfacial energies of the blocks of a BCP system provided herein are approximately equal. In another example, in some embodiments, a BCP system provided herein has a lower difference of surface/interfacial energy between its constituent blocks than poly(styrene-b-dimethylsiloxane) (PS-PDMS) or poly(styrene-b-ethylene oxide) (PS-PEO). The surface energy difference between blocks of PS-PDMS and PS-PEO leads to the preferential wetting of one domain at the surface under thermal annealing and solvent annealing conditions.

In one example, a modified poly(styrene-b-isoprene) (PS-PI) is provided in which about 75% of the PI block is modified with epoxy functional groups. The bulk and surface thermodynamics of the BCP are decoupled, allowing neutralization of differences in surface energies of the blocks of the copolymer without disordering the material. Controlling the phase-separating and surface properties of block copolymers using random copolymer blocks can be applied to other monomer combinations, including those that permit the formation of microphase separated and perpendicularly oriented lamellae (or cylinders) characterized by even smaller domain periods.

Methods

In some embodiments, methods of formulating and engineering block copolymer materials for directed assembly processes are provided. In some embodiments, the methods produce BCP systems that have interaction parameters ($\chi$) greater than that of PS-PMMA at a certain temperature. In some embodiments, the methods involve engineering a BCP to decouple the bulk phase behavior characterized by $\chi$ from the surface and/or interfacial energies (or energy differences) of its constituent blocks.

In some embodiments, the methods involve selecting a reference block copolymer and modifying one or more blocks of the reference block copolymer to provide a modified block copolymer that can be used for DSA.

In some embodiments, a reference block copolymer having only pure component blocks is selected. Modifications can include attaching functional groups to a fraction of repeat units or monomers in a block of the reference block copolymer, or otherwise chemically modifying a fraction of repeat units or monomers in a block of the reference block copolymer. Sulfonation, fluorination, hydrogenation, epoxidation, polyhedral oligomeric silsesquioxanes attachment, and liquid crystal attachment are non-limiting examples of chemical modification.

The modifications may be made during synthesis of the modified block copolymer or by post-synthesis modification of the reference block copolymer. In some embodiments, a reference block copolymer does not need to be actually synthesized.

In some embodiments, a reference block copolymer system is systematically modified during synthesis or by post synthesis modification to generate a plurality of modified block copolymers. One or more modified block copolymers from the plurality of modified block copolymers can be selected for directed self-assembly.

In some embodiments, effective interaction parameters of each of the plurality of modified block copolymers are determined. One or more modified block copolymers having an effective interaction parameter above a threshold are identified, with information about the surface and/or interfacial energies of the constituent blocks of the identified block copolymers used to select a modified block copolymer for directed self-assembly. In some embodiments, information about the surface and/or interfacial energies can be found by attempting the directed assembly of the modified block copolymers on substrates and observing which modified block copolymers result in structures parallel to the underlying substrates or otherwise display non-preferential surface or interfacial interactions at the surface of the thin film not in contact with the substrate. In some embodiments, information about the surface and/or interfacial energies can be found in the literature and/or by techniques such as measuring water contact angles.

In some embodiments, a modified block copolymer can be identified from information about the interaction parameters of different repeat units of a modified block copolymer if available. For example, to modify an A-b-B block copolymer to form an A-b-B' block copolymer, with A a pure component block and B' indicating a block having a B-C copolymer sequence, information about the effective interaction parameters of A-B, B-C and A-C can be used. In some embodiments, for example, a minimum or maximum fraction of C in the B-C copolymer can be determined by estimating that the interaction parameter of the A-b-B' block copolymer to be a weighted average of the A-B and A-C interaction parameters with respect to the B-C interaction parameter. A minimum or maximum fraction of C in the B-C copolymer sequence can then be determined for a minimum desired interaction parameter of the A-b-B' block copolymer. Other methods of estimating an effective interaction parameter can be used according to the desired embodiment.

In some embodiments, information about surface or interfacial energies of repeat units can be used to identify a modified block copolymer. For example, to modify an A-b-B block copolymer to form an A-b-B' block copolymer, with A a pure component block and B' indicating a block having a B-C copolymer sequence, information about the surface energies of A, B and C can be used. In some embodiments, for example, C can be chosen such the surface energy of A is between that of B and C. In some embodiments, a minimum or maximum fraction of C in the B-C copolymer can be determined by estimating that the difference in surface energies of the A and B' blocks to be a weighted average of the difference in A and B surface energy and the difference in A and C surface energy. A minimum or maximum fraction of C in the B-C copolymer sequence can then be determined for a maximum desired difference in surface energies of the A and B' blocks. Other methods of estimating surface energy differences can be used according to the desired embodiment.

Identifying a modified block copolymer using information about the interaction parameters and/or surface or interfacial energies as described above can be done instead of systematic modifications of a reference block copolymer or as starting point for such systematic modifications.

In addition to controlling the surface energy, interfacial energy and interaction parameter of the blocks of the modified block copolymers as described above, in some embodiments, one or more blocks can be modified to control thermophysical properties such as glass transition, crystallization, chain stiffness of the blocks of the copolymer and/or control solvent compatibility of the blocks of the block copolymer.

EXAMPLES

Example 1

The consequences on certain physical properties of controlled levels of epoxidation of the poly(isoprene) blocks in poly(styrene-b-isoprene) (PS-PI) diblock copolymers and poly(isoprene) (hPI) homopolymers was studied. hPI and symmetric PS-PI were synthesized using anionic polymerization, and specified degrees of partial epoxidation were attained by reaction with dimethyl dioxirane, where the products are denoted hPIxn and PS-PIxn. Systematic changes in the glass transition temperature ($T_{g,PIxn}$), and the order-to-disorder transition temperature ($T_{ODT}$) were measured by differential scanning calorimetry, dynamic mechanical spectroscopy and small-angle X-ray scattering (SAXS). The effective interaction parameters $\chi_{eff}$ between the PS and PIxn blocks were estimated using 1) mean-field theory together with the experimentally determined $T_{ODT}$'s and 2) the lamellar periodicities determined by SAXS. A pair-wise interaction model based on the segment-segment interaction parameters between I, S, and Ixn repeat units was fit to these results, accounting for a decrease then an increase with increasing percent epoxidation. In contrast, the surface energy of hPIxn increases linearly with percent epoxidation. These thermodynamically tunable PS-PIxn diblock copolymers are shown to form thin films with parallel and perpendicular domain alignment depending on the degree of epoxidation. Perpendicular orientation is enabled by compensation of the surface and interfacial energies of the PS and PIxn blocks of the copolymer.

The effect of the epoxidation of poly(isoprene) blocks was found by monitoring the physical properties of epoxidized poly(isoprene) (hPIxn) homopolymers and epoxidized poly(styrene-b-isoprene) (PS-PIxn) diblock copolymers with varying degrees of epoxidation (xn). Measurements of the glass transition temperature and the water contact angles of hPIxn, the rheological behavior and morphology of PS-PIxn, and an analysis of the morphology of PS-PIxn thin-films when supported on a tailored polymer mat substrate are described. The segment-segment interaction parameters $\chi_{ij}$ governing PIxn, PS and PI are estimated by fitting the binary interaction model to the effective interaction parameters $\chi_{eff}$ obtained for the PS-PIxn diblock copolymers by small-angle X-ray scattering (SAXS) and dynamic mechanical spectroscopy as interpreted assuming mean-field theory. A decoupling of bulk interaction energies (represented by $\chi_{eff}$) and differences in surface and interfacial energies exhibited by the two blocks of the copolymer due to the incorporation of the PIxn random copolymer was demonstrated. Non-preferential wetting at the substrate interface and the free surface of films may be realized at an intermediate level of epoxidation, while maintaining a state of order. These findings point to a new strategy for imposing a perpendicular domain orientation in block copolymer films with a relatively small domain periodicity. Without being bound by a particular theory, the decoupling of bulk and thin-film behaviors may be attributable to the different roles that a random copolymer architecture plays in establishing three-dimensional order versus wetting at a two-dimensional interface.

Example 1

Experimental

Anionic polymerization was used to synthesize poly(styrene) (hPS) homopolymers, poly(isoprene) (hPI) homopolymers, and poly(styrene-b-isoprene) (PS-PI) diblock copolymers. Styrene (Aldrich) and isoprene (Acros) monomers were first treated with the repetitive cycles of freezing with liquid nitrogen, pumping in vacuum, and thawing. The purification of styrene and isoprene monomers involved stirring for 30-60 minutes with dibutylmagnesium (1.0 M solution in heptane, Aldrich) and n-butullithium (2.5 M solution in hexane, Aldrich), respectively. Polymerizations of hPS, hPI, and PS-PI were initiated with sec-butyllithium (1.4 M solution in cyclohexane, Aldrich). The purified monomers of styrene and isoprene were added (sequentially for PS-PI) to the sealed reactor containing purified cyclohexane, and polymerization was conducted at 40° C. for 8 hours per each block. The reaction was terminated with methanol degassed with argon gas for 1 hour. Finally, the polymers were precipitated in methanol and dried prior to their characterization and utilization.

Controlled epoxidation of hPI and PS-PI was carried out using dimethyl dioxirane (DMD) (FIG. 1). This agent appears as an intermediate during the decomposition of potassium peroxomonosulfate ($KHSO_5$) and has been used widely in epoxidation of small molecules and polydienes. Partially reacted PS-PI and hPI with varying degrees of epoxidation (xn), denoted PS-PIxn and hPIxn, were prepared by stirring the polymer in dichloromethane (2-5 wt. %) along with acetone, the aqueous buffer solution ($NaHCO_3$ Aldrich), and the aqueous solution of potassium monosulfate triple salt (Sigma Aldrich) at room temperature for 16-48 hours. The polymer solution was extracted with separation funnels and dried under vacuum. It was assumed that the epoxidation occurs at random positions along the polymer chains.

Size exclusion chromatography (SEC) was used to determine the number average molecular weight ($M_n$) and polydispersity index (PDI) of the synthesized polymers. A Waters 717 instrument fitted with an Autosampler, columns with 5 µm pore size (Phenomenex Phenogel 5 µm, 300×7.8 mm) and a Waters 2410 Refractive Index Detector was operated with THF as the mobile phase. Proton nuclear magnetic resonance ($^1$H-NMR) (VAC-300 Autosampler, IBM Instruments) was utilized to establish the composition of the polymers and to estimate the degree of epoxidation in hPIxn and PS-PIxn.

Random copolymers ($M_n \approx 28.5$ kg/mol, PDI≈1.5) containing styrene (57 mole %), methyl methacrylate (37 mole %), and crosslinkable functional units (6 mole % glycidyl methacrylate), denoted SMG, were synthesized using nitroxide-mediated living free radical polymerization (NMP). Spin-coating a solution (0.2 wt. % in toluene) at 4000 rpm resulted in the formation of a mat, which was crosslinked during 24 hours of annealing under vacuum at 190° C.

Differential scanning calorimetry (DSC) (Q1000 DSC, TA Instruments) was used to identify the glass transition temperature ($T_g$) of polymers at a ramping rate of ±10° C./min. Rheological measurements were conducted on pressed PS-PIxn samples with an ARES rheometer (Rheometric Scientific) in two modes: isochronal experiments while heating (0.2-10° C./min) and isothermal frequency sweep measurements. In order to investigate the bulk morphology, small-angle x-ray scattering (SAXS) experiments were conducted at room temperature on PS-PIxn specimens at the Argonne National Laboratory and on a laboratory source (Materials Science Center (MSC) at the Univ. of Wisconsin at Madison) after annealing in vacuum at 105° C. for 6 hours. Data collected on an area detector were reduced to the one-dimensional form of intensity versus scattering wavevector magnitude $q=4\pi\lambda^{-1}\sin(\theta/2)$.

Solutions of PS-PIxn (1.0 wt. %, in toluene) were deposited on the spin-coated and crosslinked SMG substrates in the form of uniform thin films. Average film thicknesses ranging from $1.7d_1$ to $1.9d_1$ ($d_1=2\pi/q_1$ where $q_1$ is the principle Bragg reflection measured by SAXS) were determined with an ellipsometry instrument (AutoEL-II, Rudolph Research). The thin films were annealed at 107° C. for 6 hours in vacuum, and characterized by scanning electron microscopy (SEM) (LEO 1550-VP FESEM). The same procedure was employed to produce 22-30 nm thick films of hPS and hPIxn above bare Si wafers from 1.0 wt. % solutions in toluene. Static contact angles formed by a drop of water (1 μL) at the thin film surface (averaged over 5 to 10 measurements) were established using a goniometer (Path. Physics OCA15).

Example 1

Results and Analysis

Molecular characterization data for the poly(styrene) (hPS) and poly(isoprene) (hPI) homopolymers, and the PS-PI diblock copolymers are shown in Table 1; consistency with the targeted molecular weights and compositions and relatively low PDI's confirm successful polymerizations.

TABLE 1

Molecular characterization

| | $M_n$ (kg/mol) | $f_S^b$ | $f_I^b$ | PDI | $T_g$ (° C.) |
|---|---|---|---|---|---|
| PS-PI | 22.8[a] | 0.50 | 0.50 | 1.05 | −61.84 |
| hPI | 20.1 | 0 | 1 | 1.05 | −65 |
| hPS | 21.6 | 1 | 0 | 1.05 | 103 |

[a]The SEC measurement of the poly(styrene) block aliquots gave the result of 12.3 kg/mol. $M_n$ of PS-PI was calculated by comparing the molecular weight of the poly(styrene) aliquot with the ratio between the poly(styrene) and the poly(isoprene) blocks estimated from the NMR measurement.
[b]Densities at 140° C. were used to calculate the volume fractions.

Characterization results for the partially epoxidized diblock copolymers, denoted PS-PIxn, are shown in Table 2.

TABLE 2

Characterization of PS-PIxn

Percent epoxidation (xn) in PS-PIxn

| | 0% | 14% | 41% | 65% | 75% | 99% |
|---|---|---|---|---|---|---|
| PDI[a] | 1.05 | 1.07 | 1.09 | 1.09 | 1.09 | 1.08 |
| $T_{ODT}$ (° C.)[b] | 182 | 112 | <85 | 167 | >200 | >200 |
| $d_1$ (nm)[c] | 20.1 (LAM) | 18.5 (LAM) | Not Ordered | 20.0 (LAM) | 20.3 (LAM) | 22.0 (LAM) |

[a]Polydispersity index measured using SEC.
[b]Order-to-disorder transition temperature based on DMS measurements.
[c]The lattice spacing was calculated based on the primary peak position in the SAXS profiles measured at room temperature.
LAM denotes lamellar morphology.

Figure 2:
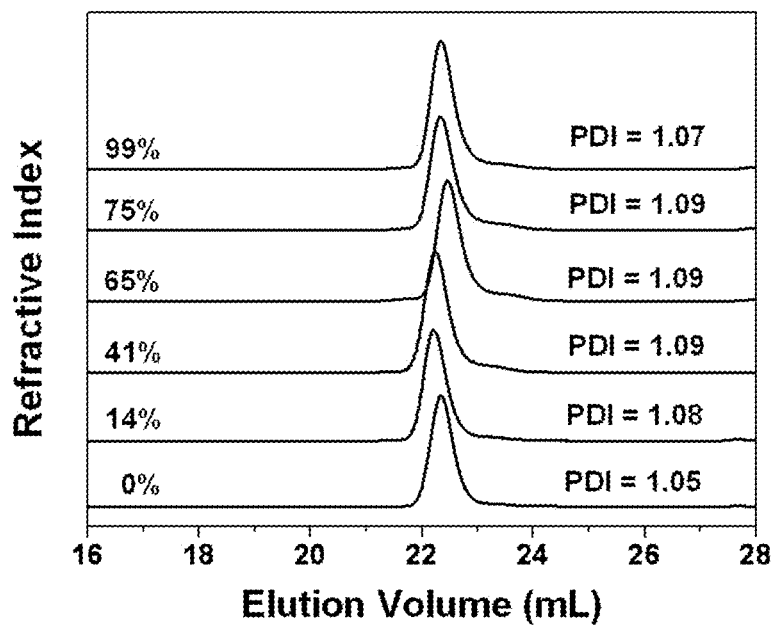
FIG. 2 shows SEC traces for PS-PIxn diblock copolymers.
Figure 3:
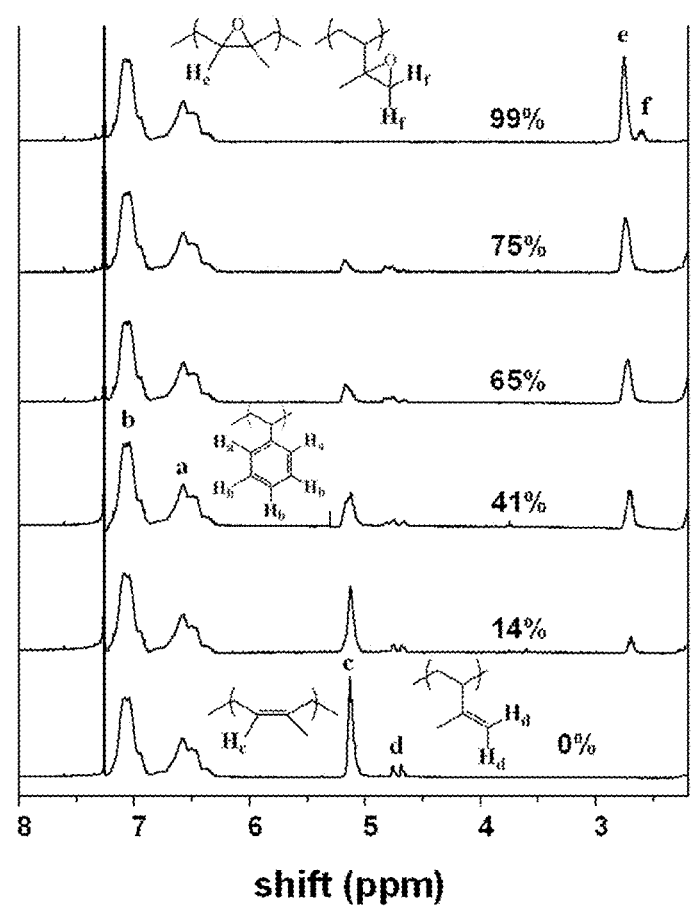
FIG. 3 shows 1H-NMR spectra for PS-PIxn. The intensities are normalized to the most intense peak associated with the poly(styrene) block and shifted vertically for clarity.

SEC traces for the PS-PIxn compounds (FIG. 2) indicate that the functionalized polymers retain monodisperse molecular weight distributions with all levels chemical modification; slight broadening of the SEC peaks may occur due to adsorption of polymers to the column. $^1$H-NMR data from PS-PIxn, shown in FIG. 3, demonstrate that resonances corresponding to 1,4 poly(isoprene) repeat units vanish and those for epoxidized 1,4 poly(isoprene) units ($\delta\approx2.75$ ppm) grow as the extent of epoxidation, xn, increases. The peaks corresponding to epoxidized 3,4 poly(isoprene) units ($\delta=2.60$ ppm) become apparent only with 99% epoxidation (PS-PI99); lower reactivity of 3,4 units relative to 1,4 units has been reported previously with other epoxidation methods for (PS-PI-PS) triblock copolymers and poly(butadiene) homopolymers. Similar results were obtained with hPI (xn=15%, 27%, 33%, 79%, 99%) including retention of the initial monodisperse PDI (1.09-1.13) (not shown here), except for minor broadening in hPI27 (PDI≈1.27).

Figure 5:
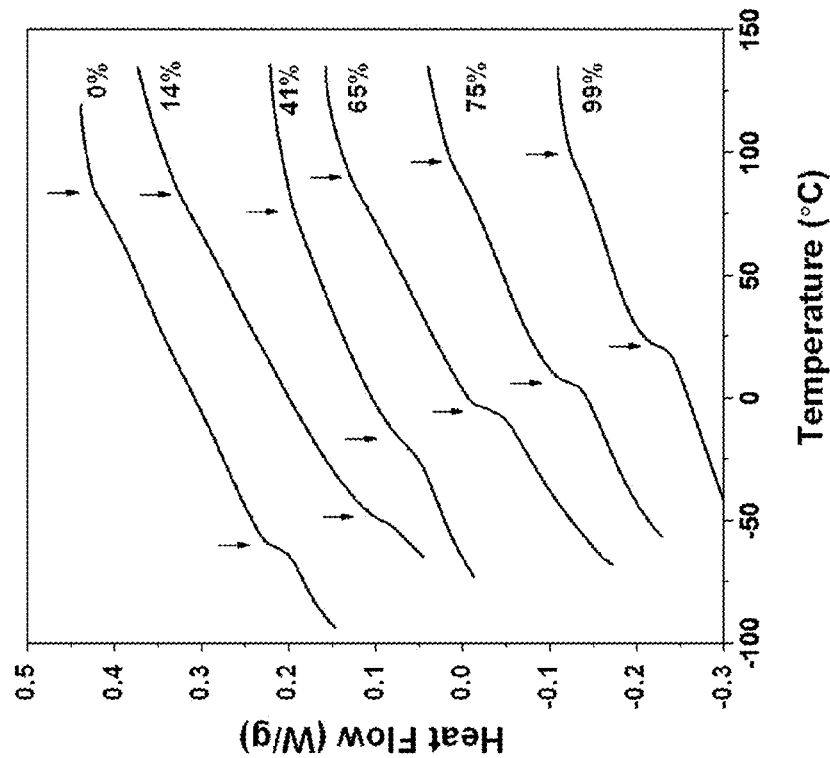
FIG. 5 shows DSC obtained from PS-PIxn as a function of % epoxidation. Arrows indicate the glass transition temperatures. Data are shifted vertically for clarity.
Figure 4:
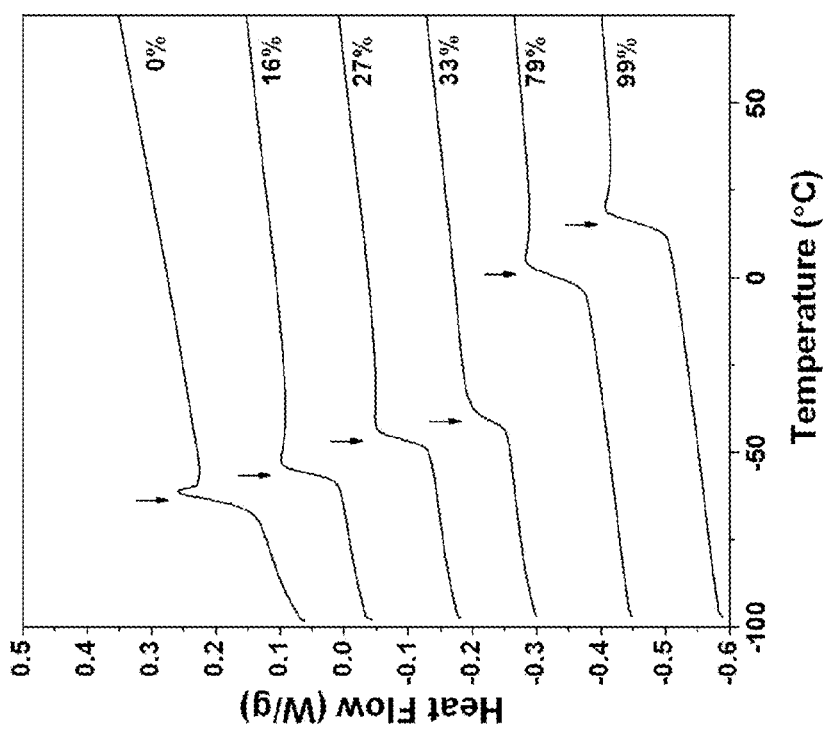
FIG. 4 shows DSC traces for hPIxn as a function of percent epoxidation. Arrows indicate the glass transition temperature. Data for 16%, 27%, 33%, 79% and 99% epoxidations are shifted vertically for clarity.
Figure 6:
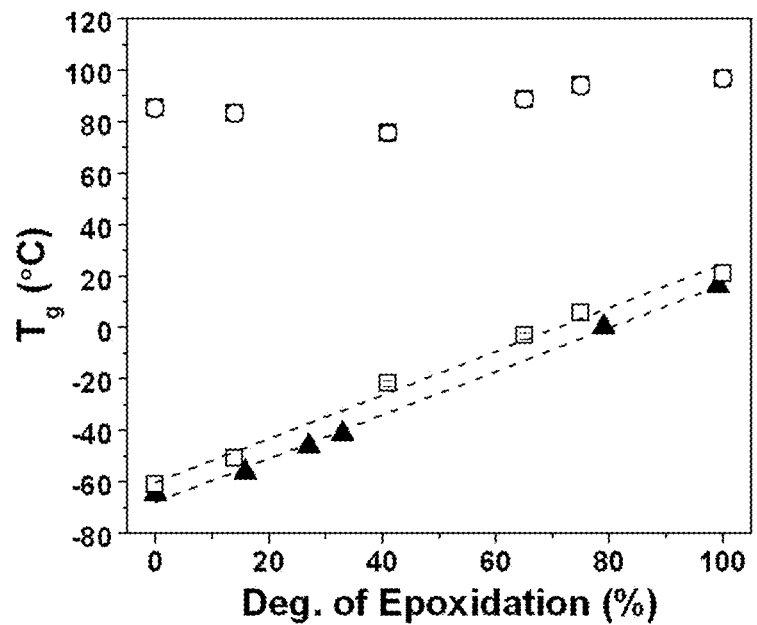
FIG. 6 shows variation in the glass transition temperature ($T_g$) for hPIxn (filled symbols) and PS-PIxn (open symbols) as a function of percent epoxidation based on DSC measurements. The dashed lines illustrate linear dependences.

FIGS. 4 and 5 show DSC traces that establish the temperature dependence of the glass transition temperatures ($T_g$) as a function of xn in hPIxn and PS-PIxn. A linear increase $T_{g,hPIxn}$ and $T_{g,PIxn}$ with the extent of epoxidation in both systems is demonstrated in FIG. 6 consistent with previous reports on epoxidized and vulcanized natural rubber (ENR). Attaching bulky groups to the polymer backbone reduces local segment rotation leading to an 80° C. increase in $T_g$ with full epoxidation. DSC traces taken with the PS-PIxn diblocks (FIG. 5) show two distinct glass transitions, suggestive of microphase segregation. Note, however, that the signature of $T_g$ for poly(styrene) in PS-PI41 is less obvious due to broadening of the transition (see below). Within experimental uncertainty, the linear increase in $T_{g,PIxn}$ for the PS-PIxn blocks nearly matches the results for hPIxn indicating that unreacted and epoxidized isoprene units within the blocks are uniformly mixed. A subtle but noticeable deviation in the PS and PIxn block $T_g$'s suggests some degree of block compatibility at intermediate levels (e.g., 14 and 41%) of epoxidation.

Figure 7:
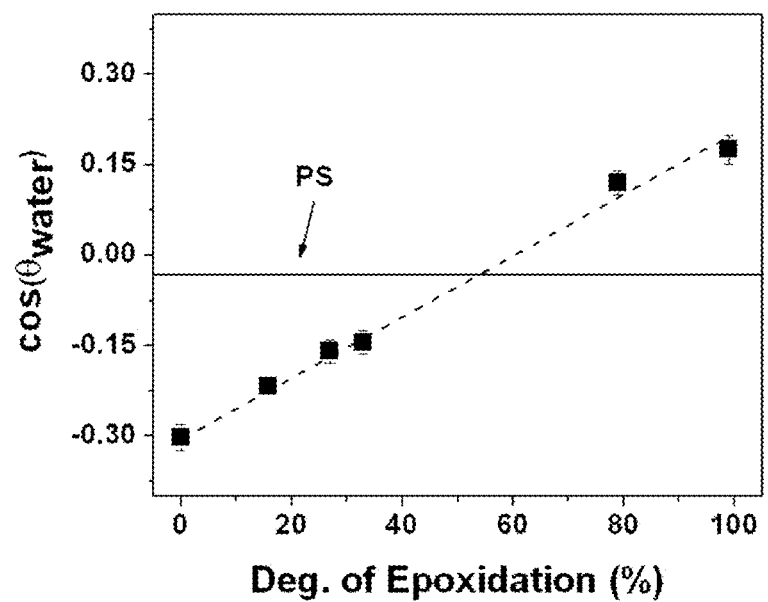
FIG. 7 shows the static contact angle ($\theta$) of water droplets (1 µL) on thin films of hPIxn (filled symbols) and poly (styrene) (hPS) (solid line). Error bars identify standard deviations and the dashed line illustrates a linear fit to the data.

The contact angle θ that a liquid drop forms with a solid surface is described by the Young equation, $$\gamma_{liquid}\cos(\theta)=\gamma_{solid}-\gamma_{solid-liquid}-\pi_e \quad (1)$$

where $\gamma_{liquid}$ is the (vapor-liquid) surface tension of the liquid. $\gamma_{solid-liquid}$ and $\gamma_{solid-liquid}$ represent the surface energy of the solid and the interfacial tension between the solid and liquid, respectively. The equilibrium spreading pressure ($\pi_e$) is generally negligible for polymer surfaces when θ>10°. Thus cos(θ) provides a qualitative measure of polymer surface energy when a single liquid compound such as water is applied to a series of chemically different materials. (Quantitative determination of $\gamma_{solid}$ uses additional information regarding $\gamma_{solid-liquid}$). The dependence on xn of the static contact angle of water ($\theta_{water}$) above cast films of hPIxn is shown in FIG. 7. Measured contact angles of 108° (hPI) and 92° (hPS) are in close agreement with previously reported values (106° and 91°, respectively). Increasing the extent of epoxidation reduces $\theta_{water}$ for the hPIxn thin films, where $\theta_{water}\approx80°$ for xn=99%. Assuming a linear dependence of $\cos(\theta_{water})$ with xn, the contact angle of hPIxn should equal that of hPS when xn is approximately 55%. Clearly, increased hPI epoxidation is accompanied by a greater surface energy.

Figure 8:
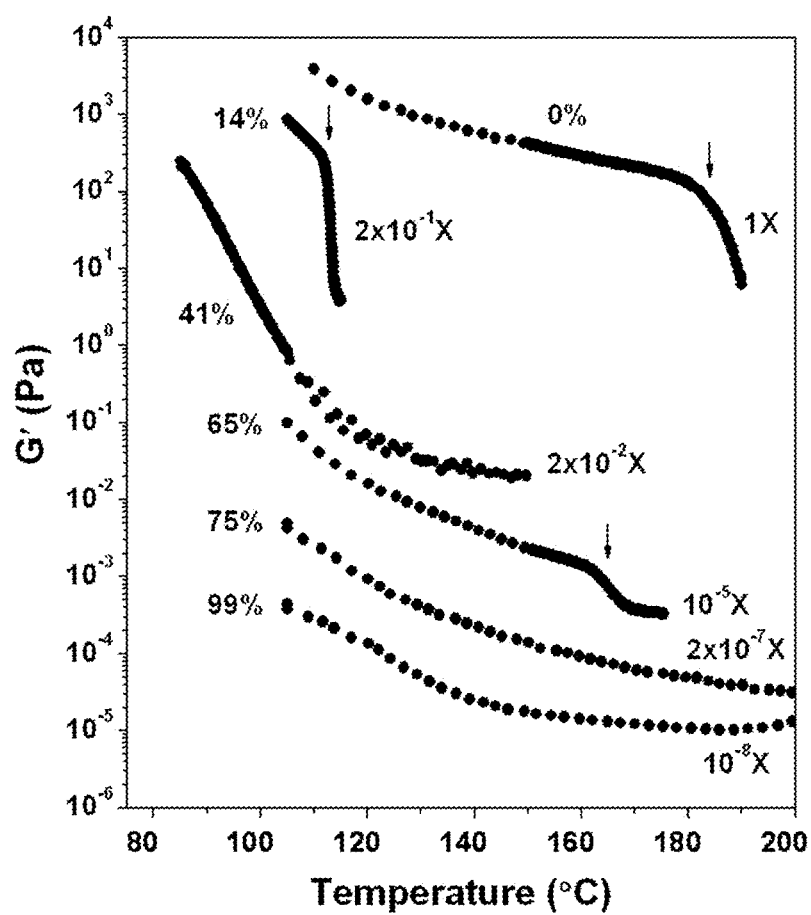
FIG. 8 shows the temperature dependence of the dynamic elastic modulus G'(1 rad/sec) for PS-PIxn diblock copolymers determined during heating (0.2-10° C./min). Arrows indicate order-to-disorder transition temperatures signaled by an abrupt change in G'. Data are shifted vertically as indicated.
Figure 9:
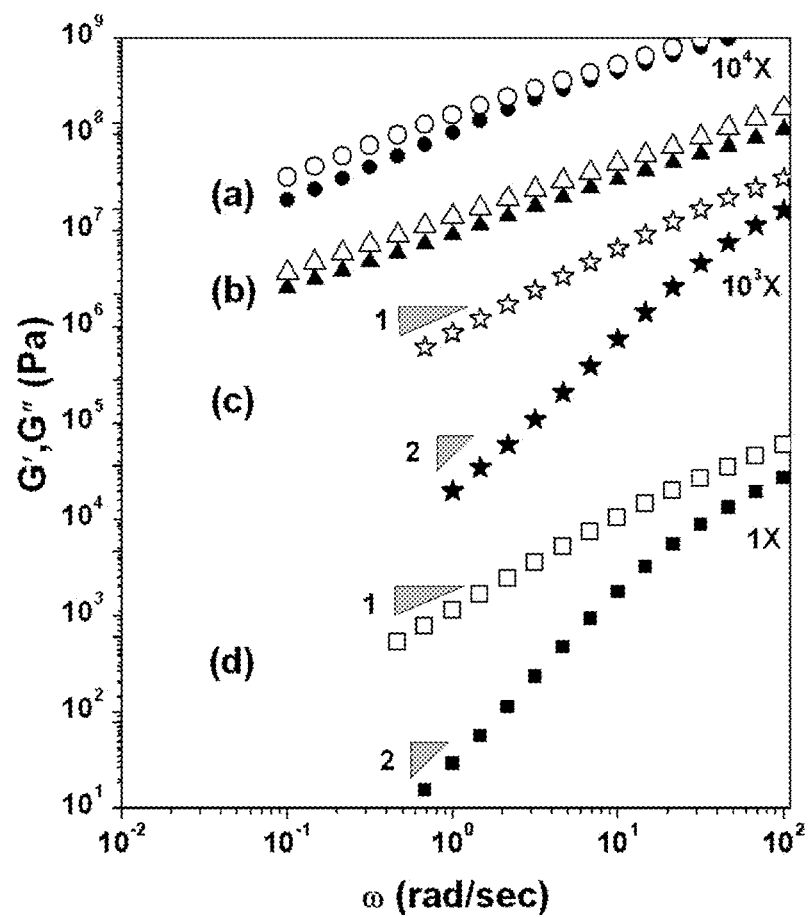
FIG. 9 shows the frequency ($\omega$) dependence of the dynamic elastic modulus G' (open symbols) and loss modulus G" (filled symbols) for (a) PS-PI at 110° C., (b) PS-PI14 at 105° C., (c) PS-PI14 at 120° C. and (d) PS-PI41 at 105° C. Data are shifted vertically as indicated for clarity.

The rheological behavior of the PS-PIxn materials was monitored as a function of xn between 85 and 200° C. Abrupt changes in G' and G" with increasing (or decreasing) temperature provide a convenient way to identify the order-to-disorder transition temperature ($T_{ODT}$). Clear evidence of ODT's can be found in the isochronal (ω=1 rad/s) linear dynamic mechanical spectroscopy (DMS) results for PS-PI, PS-PI14, and PS-PI65 as presented in FIG. 8, where $T_{ODT}$=182° C., 112° C., and 167° C., respectively. The other samples show no sign of an ODT over the range of temperatures probed, isothermal frequency experiments (0.1 rad/sec<ω<100 rad/sec) were conducted in order to establish whether specimens are ordered or disordered, and several representative results are presented in FIG. 9 for PS-PI, PS-PI14; and PS-PI41. Diblock copolymer PS-PI14 exhibits terminal behavior (G'~$\omega^2$ and G"~$\omega^1$) at 120° C. and decidedly non-terminal behavior (G'~G"~$\omega^{0.6}$) at 105° C. Both results are consistent with the assignment of $T_{ODT} \approx 112°$ C. (FIG. 8). Similarly, PS-PI is ordered at 110° C. ($T_{ODT} \approx 182°$ C. from FIG. 8) and PS-PI41 is disordered at 105° C. Based on the isochronal temperature scan for PS-PI41, it was concluded that $T_{ODT} < 85°$ C. for this material. The values of $T_{ODT}$ for PS-PIxn are summarized in Table 2.

Figure 10:
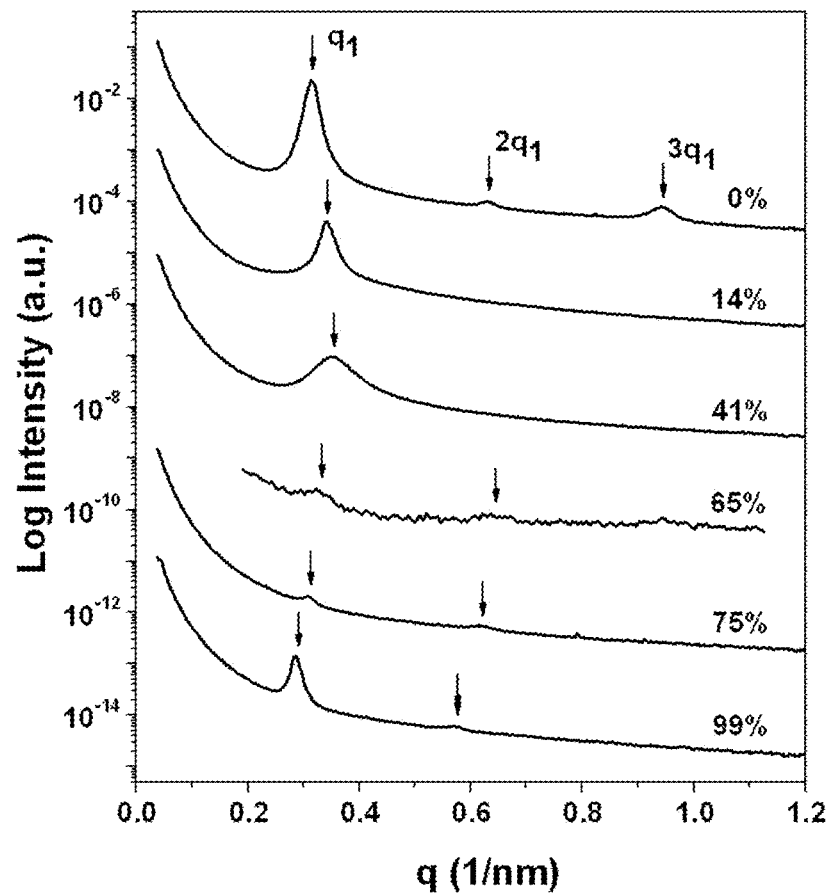
FIG. 10 shows small angle x-ray scattering (SAXS) obtained from PS-PIxn (with the indicated percentages) at room temperature. Arrows identify discernible Bragg reflections, which are consistent with a lamellar morphology. Data are shifted vertically for clarity.

Small-angle X-ray scattering (SAXS) was employed at room temperature (T<$T^g$) to determine the bulk morphology and domain dimensions for the PS-PIxn materials. FIG. 10 shows results for all six specimens, each of which displays a principle reflection at scattering wavevector $q_1$ and higher-order peaks at $q_2=2q_1$ (and $3q_1$ for PS-PI), except for PS-PI14 and PS-PI41. The $q_1$ peak for PS-PI41 is distinctly broader than those for the other diblocks, consistent with a state of disorder as deduced from the DMS measurements (FIGS. 8 and 9); a relatively high peak intensity suggest this specimen is close to ordering. Also evident is the near extinction of the scattering intensity from PS-PI65, which is attributed to a contrast matching condition at an intermediate level of epoxidation where the electron density ($\rho$) of PIxn matches that of PS; i.e., $\rho_{PI} < \rho_{PS} \approx \rho_{PI65} < \rho_{PI99}$. Overall, the SAXS results demonstrate that the ordered specimens contain a lamellar morphology as anticipated based on the symmetric compositions.

Figure 11:
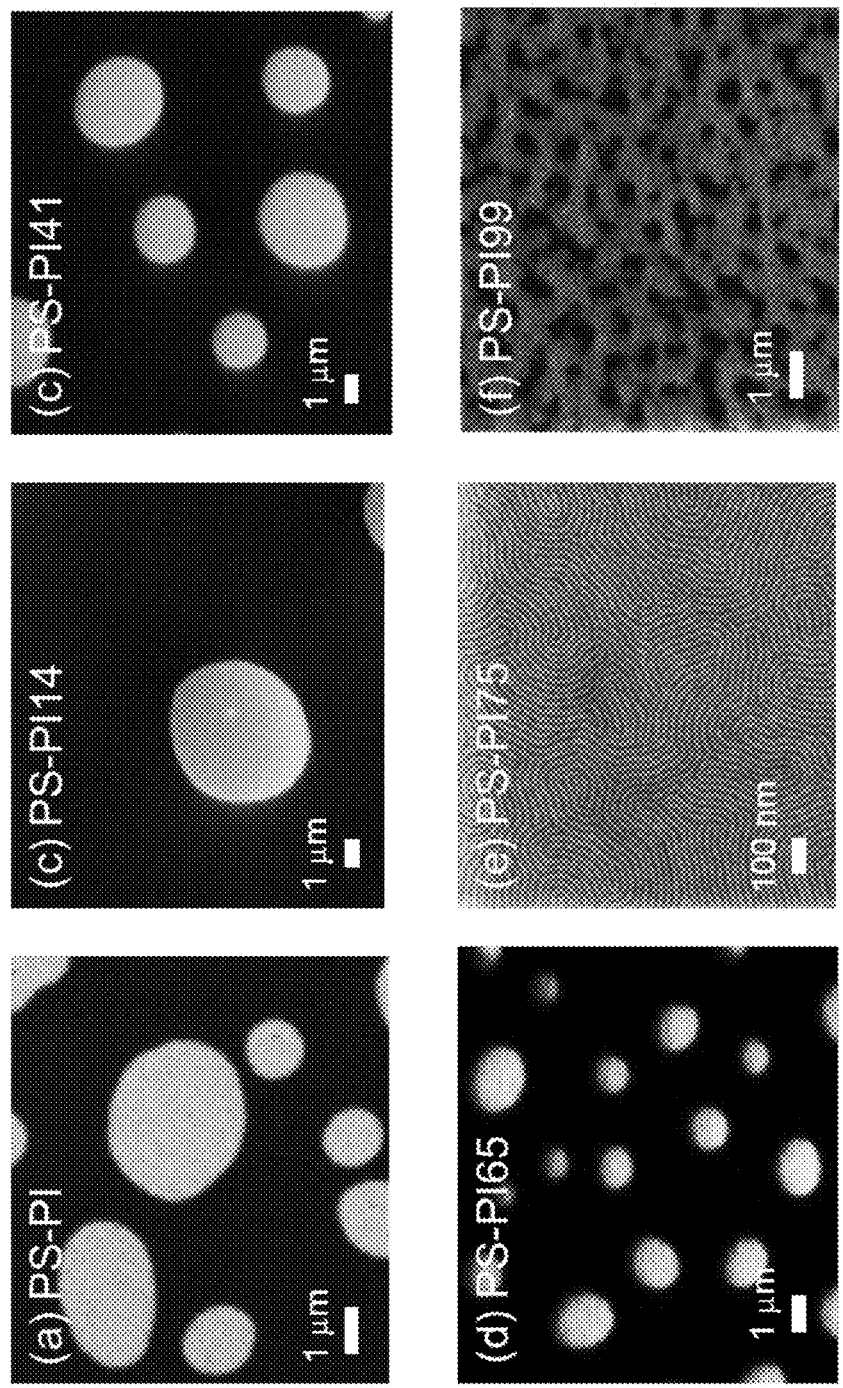
FIG. 11 shows top-down SEM images of PS-PIxn thin films above a crosslinked SMG brush. With one the exception, these images contain island and hole textures indicative of a parallel lamellar morphology. A perpendicular lamellar orientation characterizes the panel (e).
Figure 12:
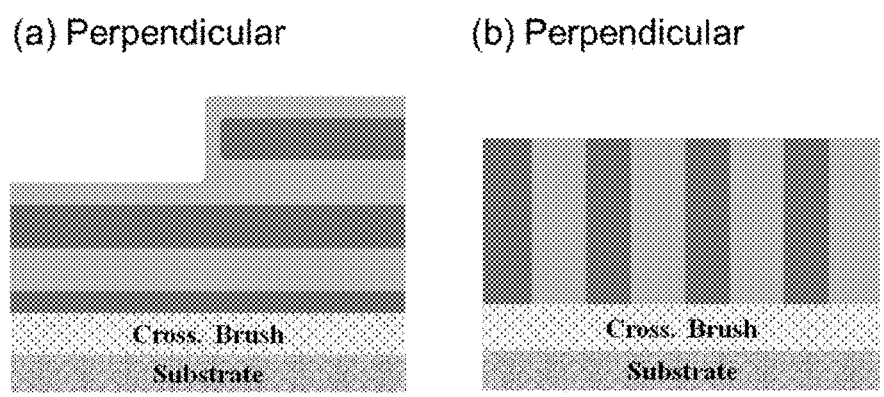
FIG. 12 shows schematic illustrations showing (a) parallel and (b) perpendicular lamellae thin-film morphologies.

Representative SEM images taken from thin-films of PS-PIxn supported on crosslinked SMG mats are shown in FIG. 11. These specimens were prepared with average film thickness 1.7 $d_1 \leq L \leq 1.9$ $d_1$, where $d_1 = 2\pi/q_1$. Except for PS-PI75, these films contain an "island and hole" texture indicative of lamellae oriented parallel to the substrate. This type of stepped surface topology occurs with incommensurate films, i.e., $L \neq n$ $d_1$ for symmetric wetting or $L \neq (n/2)$ $d_1$ for antisymmetric wetting, where n=1, 2, 3, . . . , driven by preferred wetting conditions at the (flat and rigid) substrate and unconstrained air interfaces. Panel (a) of FIG. 12 illustrates the case of antisymmetric wetting for a $1.5d_1 < L < 2.5d_1$ film. There is a free-energy penalty associated with the step defects at the boundary of $L=nd_1$ and $L=(n+1)d_1$ regions while this term vanishes with coarsening of the islands and holes in size. In sharp contrast, the PS-PI75 thin-film displays a "fingerprint" pattern (panel (e) of FIG. 11), characteristic of lamellae oriented perpendicular to the substrate as sketched in panel (b) of FIG. 12. These images all support the lamellar phase assignment established by SAM, except for sample PS-PI41, which is disordered in the bulk state at the film annealing temperature, 107° C. Preferential interfacial wetting (substrate and free film surfaces) has been shown to induce lamellar order in symmetric diblock copolymers that are disordered in the bulk state, particularly near $T_{ODT}$, which explains this result for PS-PI41.

Example 1

Discussion

Bulk phase behavior: The results described above provide clear evidence that controlled epoxidation of PS-PI diblock copolymers offers an attractive strategy for preparing materials with precisely tailored segment-segment interaction parameters. The experimental results demonstrate that the effective interaction parameter $\chi_{eff}$ between PS and the random copolymer PIxn varies systematically with temperature T and xn. Two methods were used to estimate $\chi_{eff}(T,xn)$.

Figure 13:
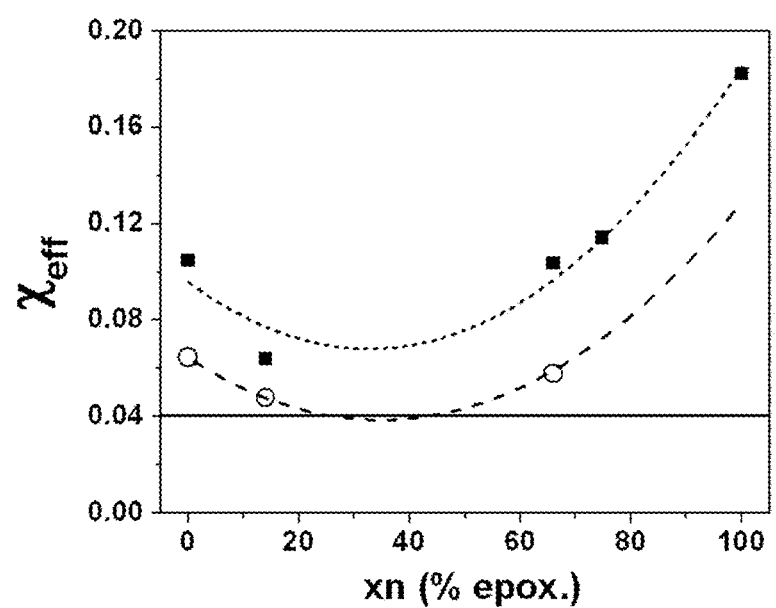
FIG. 13 shows effective interaction parameter ($\chi_{eff}$) between poly(styrene) and partially epoxidized poly(isoprene) blocks in PS-PIxn diblock copolymers, determined at 100° C. based on $d_1$ (SAXS data) (filled symbols) and $T_{ODT}$ (DMS data) (empty symbols). The curves were fit to these points using the binary interaction parameter model. The solid line identifies the mean-field ODT condition for N=259, above and below which the system is ordered and disordered, respectively.
Figure 14:
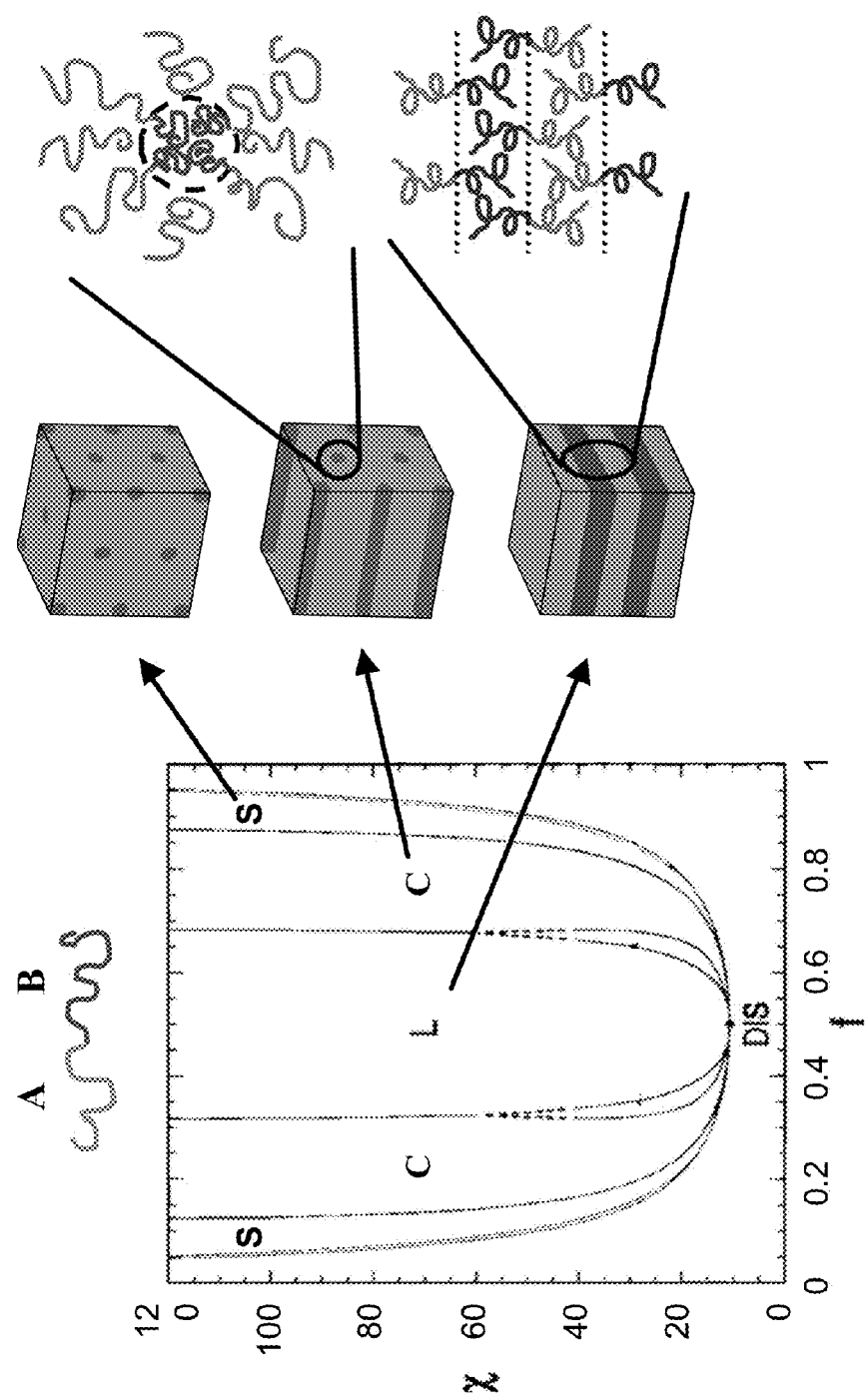
FIG. 14 shows a graph of an example of $\chi N$ as a function of the volume fraction, f, of a block (A) in a diblock (A-b-B) copolymer.

In the strong segregation limit self-consistent field theory anticipates the periodic lamellar spacing, $$d_1 = 1.10 a N^{2/3} \chi_{eff}^{1/6} \quad (2)$$

in which $\chi_{eff}$ and the degrees of polymerization N are defined based on a common segment volume v. The statistical segment length $a=R_g(N/6)^{-1/2}$ is related to the unperturbed coil radius-of-gyration $R_g$, also governed by the choice of v. The molar volumes of the PS and PI repeat units were estimated based on published densities and thermal expansivities ($\rho_{PS}=1.03$ g/cm$^3$ and $\rho_{PI}=0.86$ g/cm$^3$ at 105° C.). The density of fully epoxidized poly(isoprene) was estimated using the group contribution method (1.067 g/cm$^3$), yielding a value roughly comparable to that reported for completely epoxidized natural rubber (1.032 g/cm$^3$). The segment volume v=144 Å$^3$ was used to calculate N=259 resulting in an effective segment length a=6.53 Å ($a_{PS}=6.26$ Å and it was assumed that $a_{PIxn}=a_{PI}=6.83$ Å, both corrected for the indicated segment volume). With these parameters, $\chi_{eff}$ for xn=0%, 14%, 65%, 75%, and 99% was calculated using Equation 2. Results are plotted in FIG. 13 (solid symbols). Since these calculations are based on room temperature SAXS data (FIG. 10), the $\chi_{eff}$ values in FIG. 13 are associated with roughly T=100° C., approximately the temperature where the structure is arrested during cooling. Note that this is a rather crude treatment since Equation 2 is rigorously valid only in the limit of strong segregation. Nevertheless, prior studies have shown that this approach yields plausible estimates even close to the ODT, presumably due to the fluctuation induced first-order character of the transition.

The binary interaction model has been used successfully to describe the mixing behavior of simple homopolymers and random copolymers. For the present case this treatment reduces to:

$$\chi_{eff} = \frac{xn}{100}\chi_{SEI} + \left(1-\frac{xn}{100}\right)\chi_{SI} - \frac{xn}{100}\left(1-\frac{xn}{100}\right)\chi_{IEI} \quad (3)$$

where S, I, EI refer to poly(styrene), poly(isoprene) and epoxidized poly(isoprene) repeat units, respectively, and xn is the degree of epoxidation. The best fit to Equations 3 with the SAXS based $\chi_{eff}$ values yields $\chi_{SI} \approx 0.096$, $\chi_{SEI} \approx 0.19$, and $\chi_{IEI} \approx 0.26$. The upper (dotted) curve in FIG. 13 shows Equation 3, computed using these three interaction parameters, demonstrating a minimum at xn≈33%. This conclusion is consistent with a report of improved miscibility of poly(styrene) and natural rubber following partial epoxidation (25%, 35%, and 50%) and closely resembles the composition dependence of $\chi_{eff}$ for partially fluorinated PS-PI diblock copolymers also determined using Equations 2 and 3. According to mean-field theory, the order-disorder transition for symmetric diblock copolymers is governed by, $$(\chi_{eff} N)_{ODT} = 10.5 \quad (4)$$

where $\chi_{eff}$ is given by Equation 3. Application of Equations 3 and 4 uses information regarding the temperature dependence of the interaction parameters $\chi_{SI}$, $\chi_{SEI}$, and $\chi_{IEI}$. Generally, the interaction parameter can be expressed as a sum of enthalpic and entropic contributions, $\chi_{ij}=AT^{-1}+B$. For PS-PI diblock copolymer (with v=144 Å$^3$)

$$\chi_{SI}=28.6T^{-1}-0.0198 \quad (5)$$

which gives $\chi_{SI}=0.057$ at 100° C., close to what is shown in FIG. 13 based on the SAXS analysis. There are four unknown constants associated with $\chi_{SEI}$ (=$A_{SEI}$ T$^{-1}$+$B_{SEI}$)

and $\chi_{IEI}$ (=$A_{IEI}$ $T^{-1}$+$B_{IEI}$). These are reduced to two unknowns by assuming $\chi_{SEI}$ and $\chi_{IEI}$ exhibit the same dependence on temperature as $\chi_{SI}$, $$\chi_{SEI} = k_1 \chi_{SI} = k_1\left(\frac{A_{SI}}{T} + B_{SI}\right) \quad (6)$$

$$\chi_{IEI} = k_2 \chi_{SI} = k_2\left(\frac{A_{SI}}{T} + B_{SI}\right) \quad (7)$$

where $k_1$ and $k_2$ are simple proportionality constants. Substitution of Equations 6 and 7 into the binary interaction model yields $$\chi_{\it eff}(xn, T) = \chi_{SI}(T)\left[\frac{xn}{100}k_1 + \left(1 - \frac{xn}{100}\right) - \frac{xn}{100}\left(1 - \frac{xn}{100}\right)k_2\right]. \quad (8)$$

Solving Equations 4 and 8 with $T_{ODT}$=112° C. (xn=14%) and $T_{ODT}$=167° C. (xn=65%) leads to $k_1$=1.99 and $k_2$=3.30. $\chi_{\it eff}$(xn) is plotted in FIG. 13 (lower dashed curve) using Equation 8 with these constants. The agreement with the previous estimate (Equations 2 and 3) is quite good considering the assumptions and experimental uncertainties associated with both treatments. Also shown in FIG. 13 is the oar criterion $\chi_{\it eff,ODT}$=10.5/N (solid line); when $\chi_{\it eff}$>$\chi_{\it eff,ODT}$ the system is predicted to be ordered. Solving Equations 4 and 8 with xn=41% results in $T_{ODT}$=59° C., which is consistent with the rheological (FIG. 9) and SAXS (FIG. 10) results discussed previously within the uncertainty inherent in these calculations. The remainder of this discussion adopts the $T_{ODT}$-based model.

The concave form of $\chi_{\it eff}$ (xn) resembles the thermodynamic behavior of certain binary systems comprised of a statistical copolymer (A-ran-B) and a homopolymer (C). For example, blends of poly(ethyl methacrylate) (PEMA) and styrene-acrylonitrile copolymer (SAN) have been reported to be miscible at intermediate compositions at temperatures where neither poly(styrene) nor poly(acrylonitrile) alone is miscible with PEMA. This can be rationalized based on the effects of strongly unfavorable intramolecular interactions within the statistical copolymer relative to intermolecular interactions (i.e., $\chi_{AB}$>>$\chi_{AC}$≈$\chi_{BC}$), which drives miscibility. The binary interaction model accounts for this mechanism through the last term in Equation 3.

Thin film morphology: The morphological behavior of thin PS-PIxn films supported on the crosslinked SMG substrate (FIG. 11) in the context of the bulk phase behavior, surface energies $\gamma_{PS}$, and $\gamma_{PIxn}$, and interfacial energies $\gamma_{PS-SMG}$, and $\gamma_{PIxn-SMG}$ was considered. In order to achieve perpendicularly oriented lamellar domains via thermal annealing, the following conditions are met: 1) The substrate is not preferentially wet by either block of the copolymer, and 2) differences in the surface energies of the blocks are small.

Varying underlying interfaces not limited to a random copolymer surface (SMG) can yield a non-preferential surface for PS-PIxn at a certain percent of epoxidation. Non-preferential wetting at the substrate removes a primary enthalpic contribution that drives parallel lamellar alignment and provides an opportunity to induce the perpendicular orientation (see panel (b) of FIG. 12). Typically a range of brush or mat compositions induces perpendicular orientation of domains, and the composition of the brushes or mats depends on the film thickness and the composition of the overlying block copolymer film.

SMG mats with varying styrene composition ranging from 0% to 76% induce perpendicular ordering of PS-PIxn: (1) notably, homogeneous poly(methyl methacrylate) (PMMA) brush/mats, chemically different from components of PS-PIxn, is able to induce perpendicular ordering of PS-PIxn, and (2) the wide range of neutral compositions in random copolymers for PS-PIxn is in sharp contrast to the case of PS-PMMA that exhibits perpendicular ordering over a narrow range of the random copolymer compositions. Above SMG mats with 0% and 76% styrene mol. %. PS-PIxn exhibits a film thickness dependence, in which a cyclical pattern of morphologies that switch between perpendicular ordering and mixed lamellar morphology is observed as a function of film thickness with the period of a bulk lamellar spacing. This trend, also reported for thin-film PS-PMMA block copolymers, is associated with a slight deviation from neutral interactions by the interfaces with respect to the overlying block copolymer thin films, and such interfaces are generally called "weakly preferential."

The contact angle measurements on the hPS and hPIxn thin films (FIG. 7) suggest that the condition for equating the surface energies between PS and PIxn occurs at xn≈55%, somewhat lower than the extent of epoxidation xn=75% that actually produces the perpendicular orientation of PS-PIxn thin films. Note however that the true surface energies of PS and PIxn may not be quantitatively anticipated by the water contact angle measurements. Moreover, interfacial interactions between PS or PIxn and SMG may bias the actual surface energy compensation point somewhat. Nevertheless it was shown that symmetric PS-PIxn diblock copolymers with xn=75% form perpendicular lamellae on a crosslinked SMG substrate with a fundamental domain period of $d_1$=20 nm, i.e., comparable to the smallest dimension feasible with PS-PMMA. (Based on strong segregation scaling ($d_1$~$N^{2/3}$) and the results shown in FIG. 13, this dimension could be reduced by at least 40% without inducing disorder). Significantly, the interfacial energy between a block copolymer thin film and the substrate and differences in surface energies have been effectively neutralized without disordering the material, i.e., $\chi_{\it eff}$(xn=75%)≈0.063 while $\gamma_{PI75}$≈$\gamma_{PS}$.

This result is a direct consequence of the different roles that a random copolymer molecular architecture plays in the thermodynamics of 3-dimensional mixing versus 2-dimensional surface and interfacial phenomena. The results show that PS-PIxn phase behavior is quantitatively accounted for by the binary interaction model (Equation 3). Due to the effects of pair-wise segment interactions in 3-dimensions the minimum $\chi_{\it eff}$ (about half that of $\chi_{SI}$) occurs with xn≈33%. With one exception, preferential interactions between the segregated PS and PIxn blocks and the film interfaces (free surface and that in contact with SMG) leads to a parallel lamellar orientation accompanied by the formation of hole/island structures. The behavior of PS-PI75 is strikingly different. From a wetting perspective, PS-PI75 essentially looks free surface and interface (SMG) compensated, even though $\chi_{\it eff}$(xn≈75%)≈$\chi_{SI}$. (Clearly the surface energies $\gamma_{PS}$≈40.7 mJ/m$^2$ and $\gamma_{PI}$≈310 mJ/m$^2$ induce parallel domain alignment in PS-PI). Thus, incorporation of a random copolymer molecular architecture in one (or perhaps both) blocks of a diblock copolymer (e.g., A-b-(B-r-C)) decouples the mechanisms that govern bulk phase behavior and surface and interfacial phenomena, a strategy not available to simple A-b-B diblock copolymers such as PS-PMMA. This concept is applicable to other monomer combinations, notably those that permit formation of microphase separated and perpendicularly oriented lamellae (or cylinders) characterized by even smaller domain periods.

The parameter $\chi_{eff}$, which governs the bulk (three-dimensional) interactions, depends on $\chi_{AB}$, $\chi_{AC}$, and $\chi_{BC}$ interactions and may exhibit a minimum value at intermediate levels of compositions of the random copolymer block. The surface energy of random copolymer block, in contrast, varies approximately linearly with composition between values for pure B and pure C. These different functional forms decouple the bulk and surface thermodynamics allowing neutralization of differences in surface energies of the blocks of the copolymer without disordering the material. For the system studied here, $\chi_{eff}$ (xn=75%)≈0.063 while $\gamma_{PI75} \approx \gamma_{PS}$. This decoupling mechanism may be a direct consequence of the different roles that a random copolymer molecular architecture plays in the thermodynamics of three-dimensional mixing and demixing versus two-dimensional surface and interfacial phenomena.

Example 2

A symmetric PS-b-PI diblock copolymer with 78% epoxidation of the PI block was directed to assemble on a neutral substrate. Perpendicular orientation of the lamellar domains was achieved with a length scale $L_o$ (the width of two adjacent lamellae) of 15.3 nm. Diblock copolymer characteristics of the PS-PI precursors are given below:

| $f_S$ | $f_I$ | Mn (kg/mol) | PDI | $T_g$ (° C.) |
|---|---|---|---|---|
| 0.48 | 0.52 | 13.9 | 1.04 | −61, 68 |

Example 3

A PS-b-PI diblock copolymer with epoxidation of the PI block was assembled on a substrate chemically patterned with lines at half density of the Lo of the diblock. Alignment with density multiplication of the assembled thin film with the underlying pattern was observed on regions of the substrate.

Example 4

An asymmetric PS-b-PI diblock copolymer with 82% epoxidation of the PI block was directed to assemble on a neutral underlying mat. Perpendicular orientation of the cylindrical domains was achieved with a length scale $L_0$ (the distance between the centers of the nearest cylinders) of 20.3 nm. The increase in the fraction of cylindrical domains with perpendicular ordering was observed as the degrees of epoxidation on the PI block of PS-b-PI increased from 0% to 82% above SMG mats. Diblock copolymer characteristics of the cylinder-forming PS-PI precursors are given below.

| $f_S$ | $f_I$ | Mn (kg/mol) | PDI | $T_g$ (° C.) |
|---|---|---|---|---|
| 0.69 | 0.31 | 13.9 | 1.04 | −61, 68 |

Although the foregoing invention has been described in some detail for purposes of clarity of understanding, it will be apparent that certain changes and modifications may be practiced within the scope of the invention. It should be noted that there are many alternative ways of implementing both the process and compositions of the present invention. Accordingly, the present embodiments are to be considered as illustrative and not restrictive, and the invention is not to be limited to the details given herein.

The invention claimed is:

1. A method of formulating a block copolymer material for directed assembly, comprising:
   forming a modified block copolymer including an A block and a B' block, wherein the B' block is a B-C statistical or random copolymer,
   wherein the interaction parameter ($\chi$) of the modified block copolymer is larger than that of PS-b-PMMA at a particular temperature of assembly and wherein surface or interfacial energies of the A and B' blocks are commensurate with each other such that the BCP system can assemble in a thin film with non-preferential wetting of domains of the A and B' blocks at the surface or interface of the thin film.

2. The method of claim 1, wherein a B block of an A-b-B block copolymer is modified to form a A-b-B' block copolymer.

3. The method of claim 1, wherein the B' block includes B and C monomers and wherein the C monomers are B monomers that are modified with a functional group.

4. The method of claim 1, wherein the difference in surface energies between the A and B' blocks is no more than the difference in surface energies of PS and PMMA at a particular temperature of assembly.

5. The method of claim 1, wherein the difference in interfacial energies between the A and B' blocks is no more than the difference in interfacial energies of PS and PMMA at a particular temperature of assembly.

6. The method of claim 1, further comprising forming the B' random or statistical polymer prior to forming the modified block copolymer.

7. The method of claim 1, further comprising partially epoxidizing a B homopolymer or a B block of a A-b-B block copolymer to form the B' block.

8. The method of claim 1, wherein the A block is a homopolymer.

9. The method of claim 1, wherein the A block is a random or statistical polymer.

10. The method of claim 1, further comprising directing the assembly of a thin film of the modified block copolymer.

11. The method of claim 1, further comprising one or more of partial sulfonation, hydrogenation, fluorination, polyhedral oligomeric silsesquioxanes attachment, or liquid crystal attachment of a B homopolymer or a B block of a A-b-B block copolymer to form the B' block.

12. The method of claim 1, wherein the modified block copolymer has at least three blocks.

13. The method of claim 1, wherein the modified block copolymer is a poly(styrene-b-isoprene) block copolymer, wherein about 50% to about 90% of the polyisoprene block is modified with epoxy functional groups.

14. The method of claim 13, wherein about 70% to 80% of the polyisoprene block is modified with epoxy functional groups.

15. The method of claim 1, wherein C is a polymer having a surface energy such that the surface energy of the A block is between that of a B polymer and C.

16. The method of claim 1, further comprising experimentally determining the surface or interfacial energy of at least one of the A, B and C polymers.

* * * * *